United States Patent
Balan

(10) Patent No.: US 8,924,014 B2
(45) Date of Patent: *Dec. 30, 2014

(54) DUAL SCANNING STAGE

(75) Inventor: Aviv Balan, Mountain View, CA (US)

(73) Assignee: KLA-Tencor Technologies, Inc., Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/618,545

(22) Filed: Sep. 14, 2012

(65) Prior Publication Data

US 2013/0073082 A1 Mar. 21, 2013

Related U.S. Application Data

(63) Continuation of application No. 12/834,220, filed on Jul. 12, 2010, now Pat. No. 8,285,418.

(60) Provisional application No. 61/228,076, filed on Jul. 23, 2009.

(51) Int. Cl.
| | | |
|---|---|---|
| B25J 13/08 | (2006.01) | |
| G01N 21/88 | (2006.01) | |
| G05B 19/418 | (2006.01) | |
| H01L 21/67 | (2006.01) | |
| H01L 21/677 | (2006.01) | |
| H01L 21/68 | (2006.01) | |
| B25J 9/00 | (2006.01) | |
| H01L 21/66 | (2006.01) | |

(52) U.S. Cl.
CPC ......... *B25J 9/0096* (2013.01); *H01L 21/67288* (2013.01); *H01L 21/67742* (2013.01); *H01L 21/67748* (2013.01); *H01L 22/12* (2013.01); *H01L 21/68* (2013.01)
USPC ........................................ 700/248; 356/237.2

(58) Field of Classification Search
CPC ................... H01L 21/67288; H01L 21/67742; H01L 21/67276; H01L 21/682; B21D 43/05; B25J 9/0084; B25J 9/042; B25J 9/046; B25J 5/02; B25J 18/02; B25J 9/104; B25J 9/041; G03F 7/70725; G03F 7/70775; G03F 7/70716; G03F 7/709; B23Q 1/621; B23Q 1/623; B23Q 11/0032; B23Q 1/017; B23B 13/021; B23B 31/1071; B23P 19/06; H01R 43/28; F16F 15/06
USPC .................... 700/248; 310/12.06; 355/53, 77; 414/744.5; 269/55; 483/16; 74/490.04, 74/490.09; 140/92.1
See application file for complete search history.

(56) References Cited

U.S. PATENT DOCUMENTS 5,265,490 A * 11/1993 Azuma et al. ............. 74/490.04
5,732,750 A * 3/1998 Soriano ........................ 140/92.1

(Continued)

*Primary Examiner* — Tuan C. To
*Assistant Examiner* — Yuri Kan
(74) *Attorney, Agent, or Firm* — Luedeka Neely Group, P.C.; Rick Barnes

(57) ABSTRACT

A system having a beam for providing movement of a first stage and a second stage in a Y axis. The first stage receives a first substrate. A first motor provides movement for the first stage in an X axis. The second stage receives a second substrate. A second motor provides movement for the second stage in the X axis. The first stage and the second stage move together in the Y axis and independently in the X axis. A robot loads substrates onto the first stage and the second stage. A controller directs the robot to load a second substrate onto the second stage while simultaneously directing the first stage and the guide beam to scan a first substrate.

7 Claims, 2 Drawing Sheets

(56) References Cited

U.S. PATENT DOCUMENTS

| | | | |
|---|---|---|---|
| 5,969,441 A * | 10/1999 | Loopstra et al. | 310/12.06 |
| 6,327,929 B1 * | 12/2001 | Yanagisawa | 74/490.09 |
| 6,752,584 B2 * | 6/2004 | Woodruff et al. | 414/744.5 |
| 6,975,383 B2 * | 12/2005 | Morisada | 355/53 |
| 8,285,418 B2 * | 10/2012 | Balan | 700/248 |
| 8,366,592 B2 * | 2/2013 | Hathaway et al. | 483/16 |
| 2005/0230894 A1 * | 10/2005 | Scharer | 269/55 |
| 2010/0036525 A1 * | 2/2010 | Casanelles et al. | 700/248 |
| 2010/0053589 A1 * | 3/2010 | Hashemi et al. | 355/77 |
| 2011/0022227 A1 * | 1/2011 | Balan | 700/248 |
| 2013/0073082 A1 * | 3/2013 | Balan | 700/248 |

* cited by examiner

US 8,924,014 B2

DUAL SCANNING STAGE

FIELD

The application claims all rights and priority on prior pending U.S. application Ser. No. 12/834,220 filed 2010 Jul. 12 and U.S. provisional patent application Ser. No. 61/228,076 filed 2009 Jul. 23. This invention relates to the field of integrated circuit fabrication. More particularly, this invention relates to a stage for handling more than one substrate at a time.

INTRODUCTION

Profiling instruments were first developed for the purpose of characterizing integrated circuit substrate surfaces in terms of roughness, waviness, and form. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, optical disks, solar cells, and charge coupled devices.

In a conventional stylus profilometer, a substrate is placed on an X-Y positioning stage, where the surface of the substrate to be profiled is within the X-Y plane. The profilometer has a stylus that is attached to a sensor. In a data acquisition sequence, at least one of the stage and the stylus is moved relative to the other, while the sensor senses variations in the topography of the substrate under the stylus. In some profilometers it is the stage that is moved, and in other profilometers it is the stylus that is moved.

Stylus profilometers provide for scans in the X-Y plane covering distances that range from a few microns to hundreds of millimeters. The sensors used for profilometers usually have relatively large dynamic range in the Z direction, from as small as a few angstroms to as large as a few hundred micrometers.

The throughput of a profilometer is dependant on the load and unload time of the substrates being measured. Up to about forty percent of the total substrate processing time can be spent on loading, unloading, and aligning the substrates.

What is needed, therefore, is a system that reduces problems such as those described above, at least in part.

SUMMARY OF THE CLAIMS

The above and other needs are met by a stage system having a guide beam for providing translational movement of a first stage and a second stage in a Y axis. The first stage receives a first substrate, and is slidably mounted to the guide beam. A first motor provides independent translational movement for the first stage in an X axis. The second stage receives a second substrate, and is also slidably mounted to the guide beam. A second motor provides independent translational movement for the second stage in the X axis. The first stage and the second stage move together in the Y axis as the guide beam moves in the Y axis, and move independently of one another in the X axis. A robot loads and unloads substrates onto and off of the first stage and the second stage. A controller directs the robot to load a second substrate onto the second stage while simultaneously directing the first stage and the guide beam to scan a first substrate on the first stage in the X and Y axes.

In this manner, an instrument using the stage system, such as a profilometer, does not need to wait for the preceding substrate to be off-loaded and the succeeding substrate to be loaded before commencing readings on the succeeding substrate. Instead, the succeeding substrate is loaded, aligned, and ready for readings to start as soon as the readings on the preceding substrate are completed. Then while the succeeding substrate is being read, the preceding substrate is off-loaded, and another substrate is loaded and prepared for readings. In this manner, the instrument is continually taking readings, and the throughput of the instrument is increased.

In various embodiments according to this aspect of the invention, a first Z motor moves the first stage in a Z axis, and a second Z motor moves the second stage in the Z axis, where the movement of the first stage in the Z axis is independent of the movement of the second stage in the Z axis. In some embodiments a first rotational motor rotates the first stage, and a second rotational motor rotates the second stage, where the rotation of the first stage is independent of the rotation of the second stage. In some embodiments the robot includes a first robot and a second robot, where the first robot loads and unloads the first substrate on to and off of the first stage, and the second robot loads and unloads the second substrate on to and off of the second stage.

According to another aspect of the invention there is described a method of staging a first substrate and a second substrate, by loading the first substrate onto a first stage, scanning the first stage in an X axis and a Y axis, loading the second substrate onto a second stage while continuing to scan the first stage, and scanning the second stage in the X axis and the Y axis. Movement in the X axis is independent between the first stage and the second stage, and movement in the Y axis is not independent between the first stage and the second stage. The second stage is scanned while the first substrate is unloaded from the first stage.

In various embodiments according to this aspect of the invention, the first and second stages are moved in the Z axis, where the movement of the first stage in the Z axis is independent of the movement of the second stage in the Z axis. In some embodiments the first and second stages are rotated, where the rotation of the first stage is independent of the rotation of the second stage.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the different views, and in which.

DETAILED DESCRIPTION

Figure 1:
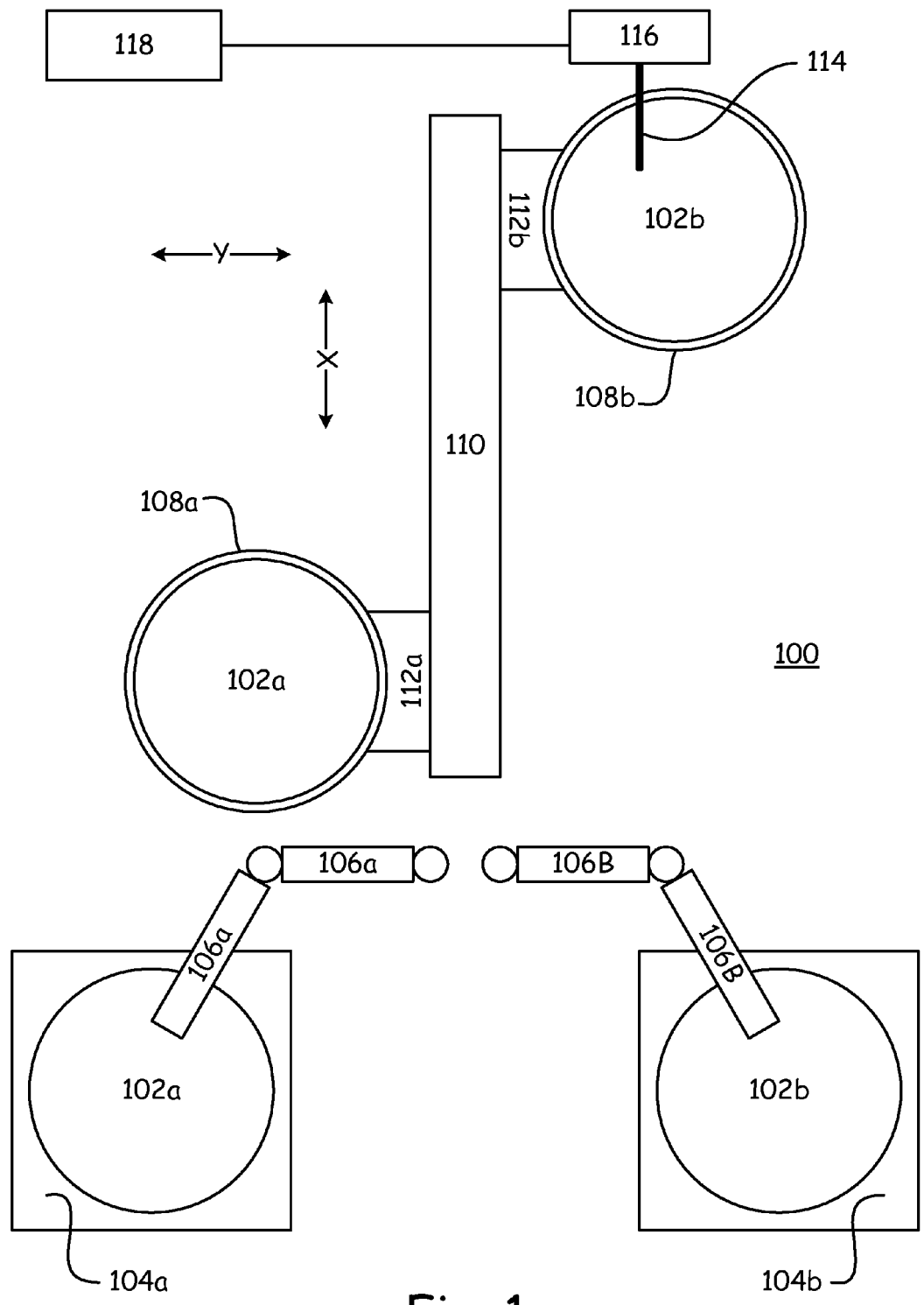
FIG. 1 is a functional block diagram of a dual stage scanning system according to a first embodiment of the present invention.

With reference now to FIG. 1, there is depicted a stage system 100 according to a first embodiment of the present invention. As a general overview of the system 100, a robot arm 106 removes substrates 102 such as from a cassette elevator 104, and positions the substrates 102 onto a stage 108. The stage 108 is moved in the X axis by a motor 112. The motor 112 in some embodiments can also control rotation of the stage 108 and movement of the stage 108 in the Z axis. In other embodiments, rotation and movement of the stage 108 are accomplished by separate motors that are dedicated to such functions (not depicted so as to not unnecessarily encumber the drawing). Movement of the stage 108 in the Y axis is accomplished by moving a guide rail 110, along which the stage 108 moves in the X axis.

At least some of these elements of the stage system 100 as described above are duplicated, in that more than one of a given element is provided in some embodiments of the system 100. For example, the stage system 100 has at least two stages 108a and 108b, which can each hold one substrate 102a and 102b simultaneously. The system 100 also has two motors 112a and 112b, which can move the substrates 102a and 102b independently of one another. However, the system 100 has only one guide rail 110, along which the two stages 108a and 108b move.

In some embodiments, two robots 106a and 106b are provided, for loading substrates 102 onto the stages 108a and 108b. In other embodiments, only a single robot 106 is provided. In some embodiments, substrates 102 are loaded from two different cassette elevators 104a and 104b. In other embodiments, only a single cassette elevator 104 is provided.

The stage system 100 scans one substrate 102 at a time under the stylus 114. The stylus 114 is connected to a sensor 116, which sends electrical signals to a controller 118, in regard to the surface profile of the substrate 102. The controller 118 also controls the movement of the guide rail 110, stages 108, robot(s) 106, and cassette elevators 104.

In operation, a first substrate 102a is loaded onto the first stage 108a. The motor 112a and the guide rail 100 position the first substrate 102a under the stylus, and begin to scan the substrate 102a back and forth, such as in a serpentine manner, so as to develop a surface profile of the first substrate 102a.

While this first scanning routine of the first substrate 102a is being accomplished, the controller 118 directs a second substrate 102b to be loaded onto the second stage 108b, so that it can be aligned and ready to be scanned as soon as the scanning of the first substrate 102a is completed. Once the scanning of the first substrate 102a is completed, the scanning sequence of the second substrate 102b under the stylus 114 commences without any delay.

While the second substrate 102b is being scanned, the controller 118 directs the first substrate 102a to be off-loaded from the first stage 108a, and a subsequent substrate 102a to be loaded onto the first stage 108a. This subsequent substrate 102a is then aligned and prepared for scanning while the scanning of the second substrate 102b continues, so that the subsequent substrate 102a is ready to be scanned as soon as the scanning of the second substrate 102b is completed.

In this manner, the system 100 never has to wait for a substrate 102 to be loaded and aligned before scanning of the substrate 102 commences, because the next substrate 102 to be scanned is loaded and aligned while the prior substrate 102 is being scanned. This is made possible by the dual scanning stages 108, which move independently of one another in the X, Z, and rotational directions. However, by using a common guide beam 110 to move the substrates 102 in the Y direction, hardware costs of the system 100 are reduced.

Figure 2:
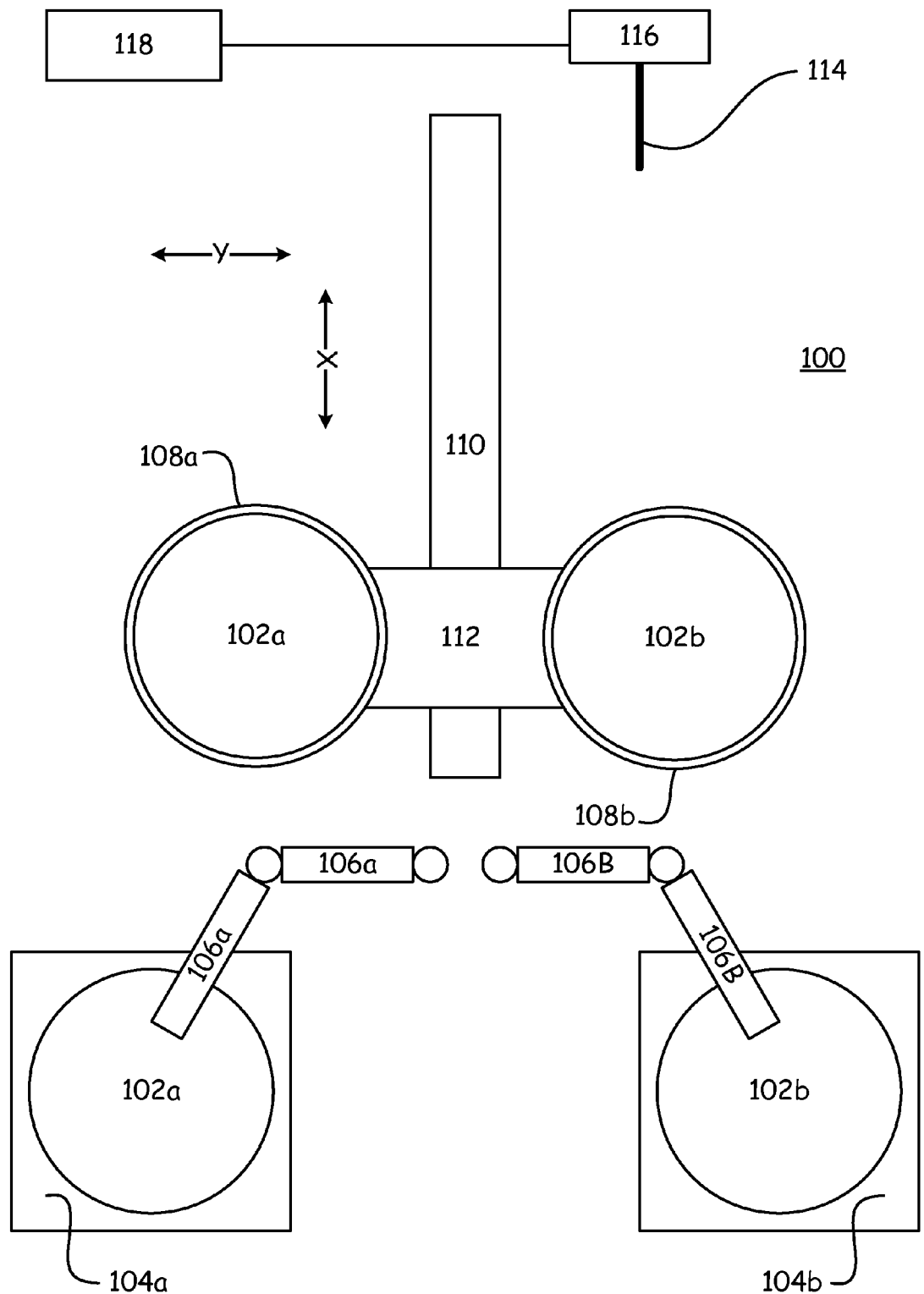
FIG. 2 is a functional block diagram of a dual stage scanning system according to a second embodiment of the present invention.

An embodiment of the stage system 100 according to another aspect of the invention is depicted in FIG. 2. In this embodiment, the two stages 108 move together in the Y axis according to the movement of the guide rail 110, but also move together in the X axis according to the movement of a single motor 112. In further embodiments according to this aspect of the invention, the two stages 108a and 108b each have separate motors for independent rotation and elevation (movement in the Z axis) of the substrates 102a and 102b. This embodiment could be used, for example, when two optical heads are provided in the stage system 100, such as when the two optical heads have different resolutions.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A stage system, comprising:
a guide beam for providing translational movement of a first stage and a second stage in a Y axis,
the first stage for receiving a first substrate, the first stage slidably mounted to a first side of the guide beam, the first stage associated with a first motor for providing independent translational movement for the first stage in an X axis,
the second stage for receiving a second substrate, the second stage slidably mounted to an opposing second side of the guide beam, the second stage associated with a second motor for providing independent translational movement for the second stage in the X axis,
where the first stage and the second stage can only move together in the Y axis, as the guide beam moves in the Y axis, and move independently of and past one another in the X axis along opposing sides of the guide beam,
a robot for loading and unloading substrates onto and off of the first stage and the second stage, and
a controller for directing the robot to load a second substrate onto the second stage while simultaneously directing the first stage and the guide beam to scan a first substrate on the first stage in the X and Y axes.

2. The stage system of claim 1, further comprising a first Z motor for moving the first stage in a Z axis, and a second Z motor for moving the second stage in the Z axis, where the movement of the first stage in the Z axis is independent of the movement of the second stage in the Z axis.

3. The stage system of claim 1, further comprising a first rotational motor for rotating the first stage, and a second rotational motor for rotating the second stage, where the rotation of the first stage is independent of the rotation of the second stage.

4. The stage system of claim 1, wherein the robot comprises a first robot and a second robot, the first robot for loading and unloading the first substrate on to and off of the first stage, and the second robot for loading and unloading the second substrate on to and off of the second stage.

5. A method of staging a first substrate and a second substrate, the method comprising the steps of:
loading the first substrate onto a first stage,
scanning the first stage in an X axis and a Y axis,
loading the second substrate onto a second stage while continuing to scan the first stage,
scanning the second stage in the X axis and the Y axis, where movement in the X axis is independent between the first stage and the second stage, and movement in the Y axis is not independent between the first stage and the second stage, and scanning the second stage while the first substrate is unloaded from the first stage.

6. The method of claim 5, further comprising moving the first stage in a Z axis, and moving the second stage in the Z axis, where the movement of the first stage in the Z axis is independent of the movement of the second stage in the Z axis.

7. The method of claim 5, further comprising rotating the first stage and the second stage, where the rotation of the first stage is independent of the rotation of the second stage.

* * * * *